United States Patent
Delaire et al.

(10) Patent No.: US 12,274,018 B1
(45) Date of Patent: Apr. 8, 2025

(54) CONNECTORS GUIDE FOR AN INVERTER COMPRISING A TEMPERATURE SENSOR HOUSING

(71) Applicant: NIDEC PSA EMOTORS, Carrieres sous Poissy (FR)

(72) Inventors: Quentin Delaire, Sevres (FR); Nicolas Musseau, Premilhat (FR); Paul Doublet, Sartrouville (FR)

( * ) Notice: Subject to any disclaimer, the term of this patent is extended or adjusted under 35 U.S.C. 154(b) by 0 days.

(21) Appl. No.: 18/842,783

(22) PCT Filed: Apr. 19, 2023

(86) PCT No.: PCT/FR2023/050565
§ 371 (c)(1),
(2) Date: Aug. 29, 2024

(87) PCT Pub. No.: WO2023/222965
PCT Pub. Date: Nov. 23, 2023

(30) Foreign Application Priority Data

May 19, 2022 (FR) ...................................... 2204797

(51) Int. Cl.
  *H05K 7/14* (2006.01)
  *H05K 7/20* (2006.01)

(52) U.S. Cl.
  CPC ....... *H05K 7/14324* (2022.08); *H05K 7/2089* (2013.01)

(58) Field of Classification Search
  CPC ....................................................... H05K 7/14
  See application file for complete search history.

(56) References Cited

U.S. PATENT DOCUMENTS 10,778,117 B2 * 9/2020 Song ................... H05K 7/14329
10,917,992 B2 * 2/2021 Feurtado .............. H05K 5/0069

FOREIGN PATENT DOCUMENTS

EP 3177122 A1 * 6/2017 ............. H01R 12/52
EP 3582287 A1 * 12/2019 ............. B60L 1/003
(Continued)

OTHER PUBLICATIONS

International Search Report for corresponding PCT/FR2023/050565 mailed Aug. 24, 2023.
(Continued)

*Primary Examiner* — Mukundbhai G Patel
(74) *Attorney, Agent, or Firm* — Sandberg Phoenix & von Gontard, PC

(57) ABSTRACT

The invention relates to a connector guide for an inverter comprising at least two power modules (28), namely at least a first power module and a second power module, the connector guide (1) comprising a substantially flat rigid body (2) in which orifices (5) are formed for the passage of control pins (8) for the power modules (28), said orifices (5) being calibrated and positioned in such a way as to conform to the position and orientation of said control pins (8). The body of the connector guide comprises a so-called intermediate portion (13) which is intended to be positioned between the first power module and the second power module, the intermediate portion (13) comprising a housing (15) suitable for accepting a temperature sensor (16). The connector guide thus makes it possible to ensure that the power modules control pins are correctly positioned while at the same time also ensuring the positioning and retention of the temperature sensor.

12 Claims, 6 Drawing Sheets

(56) References Cited

FOREIGN PATENT DOCUMENTS

EP      3177123 B1    2/2021
FR      3044861 B1    1/2018

OTHER PUBLICATIONS

Written Opinion for corresponding PCT/FR2023/050565 mailed Aug. 24, 2023.

* cited by examiner

CONNECTORS GUIDE FOR AN INVERTER COMPRISING A TEMPERATURE SENSOR HOUSING

CROSS-REFERENCE TO RELATED APPLICATIONS

This application is the US National Stage under 35 USC § 371 of International Application No. PCT/FR2023/050565 which claims the priority to French application 2204797 filed on May 19, 2022, the content (text, drawings and claims) of both said applications being incorporated by reference herein.

BACKGROUND

The present application relates to the field of assemblies of electrical inverters. It especially relates to inverters that are suitable for controlling the operation of an electric traction machine of an electric or hybrid vehicle, for example a motor vehicle.

In the field of power electronics, an inverter is a voltage converter used to generate alternating voltages and currents from an electrical energy source of a different voltage or frequency. In particular, an inverter can be used to generate the AC voltages required to operate an electric motor, whether synchronous or asynchronous, from a DC voltage source, such as an electric battery.

A polyphase inverter, for example a three-phase inverter, chops a DC voltage into a balanced polyphase (e.g. three-phase) sinusoidal voltage.

For this purpose, inverters include power modules including electronic switches, such as IGBTs (Insulated Gate Bipolar Transistor), whose openings and closings are appropriately controlled.

An inverter of this kind includes an assembly of several components: electronic boards (control board and power board or "driver board", optionally combined into a single board), a number of power modules, electrical connections in the form of interconnection bars (generally referred to as busbars) and sensors.

The one or more electronic boards are formed on printed circuit boards (PCBs).

The components of the inverter are generally placed in a protective casing, also referred to as case.

The various components mentioned above thus interface mechanically and/or electronically with one another in a relatively complex configuration.

Assembling an inverter is therefore a complex task, requiring the use of measurements to ensure the correct positioning and orientation of components in relation to each other.

In particular, the power modules include male control connectors in the form of control pins. The matching female connectors, intended to receive these control pins of the power modules, can be receiving holes formed in the electronic board (control board or single electronic board), enabling the pins to be soldered once they have been correctly inserted through the electronic board.

All the control pins of the power modules must be precisely and simultaneously positioned relative to the female connectors, i.e. the receiving holes, of the electronic board.

Given that a power module includes several control pins (typically five pins or more), and that the power modules are assembled independently in the inverter case, this precise positioning is complex to achieve.

To achieve this positioning, it is known to cover the connectors of the power module with a connector guide or "pin guide". A connector guide is a part, for example made of plastic, which has calibrated passages into which the male connectors of the power modules are inserted in order to maintain them in the desired position and orientation so that they can simultaneously be perfectly aligned with the female connectors of the electronic board into which they are to be inserted.

For example, document FR3044861 discloses a starter-alternator system including power modules and an electronic board support forming a connector guide.

Similarly, document EP3177122A1 describes an example of an electronic board support which includes means for guiding electrical connection elements of power electronic modules toward the board.

For reasons of control, reliability and safety of the inverter, it is important to know the temperature of the power modules (or to have information that is representative of this temperature). To this end, the power modules may include an integrated temperature sensor. Alternatively, temperature sensors external to the power modules and suitable for providing a measurement representative of the temperature of the power modules can be provided. For example, the temperature can advantageously be measured in contact with a cooling plate of the power modules, by a temperature sensor supported by the control board. The temperature sensor can thus include a thermistor attached to a printed circuit board that is rigidly connected to the control electronic board (or, where applicable, to the single main electronic board) of the inverter. Nevertheless, assembling a temperature sensor that is not integrated into the power modules is complex in the environment of an inverter for several reasons. Firstly, given the stacked nature of the various elements that make up the inverter, access to areas that allow a temperature measurement (typically, the cooling plate of the power modules) is complex. Additionally, as the sensor is generally attached to the control board of the inverter, it is particularly complex to ensure respect for a chain of dimensions that makes it possible to ensure that the sensor is in contact with the element of which the temperature is to be measured (e.g. the cooling plate of the power modules).

SUMMARY

A goal is to provide a device that solves all or part of the problems mentioned hereinbefore.

Disclosed herein is a connector guide for an inverter including at least two power modules, namely at least a first power module and a second power module, the connector guide including a substantially flat rigid body in which orifices are formed for the passage of control pins of the power modules, the orifices being calibrated and positioned in such a way as to conform to the position and orientation of the control pins. The body of the connector guide includes an intermediate portion which is intended to be positioned between the first power module and the second power module, the intermediate portion including a housing suitable for receiving a temperature sensor.

The power modules of the inverter can be placed side-by-side in the same plane. They can especially have a flat surface aligned in the same plane.

The connector guide thus makes it possible to ensure that the control pins of the power modules are correctly positioned and oriented when assembling an inverter, and to position one (or more) temperature sensors in the inverter. It also ensures, if need be, the position and orientation of the connectors of the one (or more) temperature sensors. These functions are carried out by means of a single part, thus simplifying the assembly. In particular, it is not necessary to use a temperature sensor integrated in the power modules, and by taking advantage of the space between two power modules to integrate the temperature sensor, the chain of dimensions for assembling the temperature sensor is very straightforward. The temperature sensor can therefore be reliably installed.

The orifices for the passage of the pins can have a straight cylindrical upper part and a flared lower part. The flared lower part of all or part of the orifices may, for example, be tapered. The flared lower part of two adjacent orifices may include a straight median wall.

These configurations of the passage orifice of the connection pins enable a relatively high degree of correction in the event of inaccuracy in the relative positions thereof, and facilitate the guiding thereof when the connector guide is placed on the power modules. In particular, the straight median wall makes it possible to effectively separate the pins and prevents two pins from being inserted into the same orifice.

The housing suitable for receiving a temperature sensor is advantageously open on a lower face of the body of the connector guide so as to be able to insert the temperature sensor into the housing via the lower face and bring it into abutment on an upper abutment of the housing. Alternatively, the housing suitable for receiving a temperature sensor is open on an upper face of the body of the connector guide so that the temperature sensor can be inserted into the housing via the upper face, the housing further including an abutment allowing the temperature sensor to be brought into abutment, the housing further including a bottom opening allowing the temperature sensor to protrude, the housing further being provided with a device for retaining the temperature sensor. The connector guide proposed in the invention can therefore be suitable for different types of temperature sensors.

The body of the connector guide can include a first overlapping portion intended to at least partially overlap the first power module, and the body of the connector guide includes a second overlapping portion intended to at least partially overlap the second power module.

The intermediate portion is then located between the two overlapping portions, which it connects. The at least partial overlap of the power modules makes it possible to stiffen the connector guide and ensures the overall cohesion of the stack of the various elements of the inverter.

The connector guide can include three overlapping sections, for the at least partial overlapping of three power modules.

The inverter that implements such a connector guide thus includes three power modules. This is the traditional architecture of an inverter for obtaining a three-phase sinusoidal current, for example to supply an electric traction machine for a motor vehicle.

The connector guide can include at least one wall orthogonal to a general plane of extension of the body of the connector guide. Such a wall ensures the electrical insulation of the elements it separates, and in particular prevents the formation of electric arcs.

Also disclosed is a system including:
  a plurality of power modules; each power module including control pins,
    a connector guide as described hereinbefore, with each control pin of the power modules passing through an orifice of the connector guide,
    a temperature sensor installed in the housing, and
    a cooling plate in contact with the power modules,
    wherein the temperature sensor is in contact with the cooling plate.

In such a system, with the connector guide including at least one wall orthogonal to a general plane of extension of the body of the connector guide, and each power module including terminals that extend substantially parallel to the general plane of extension of the body of the connector guide, the at least one wall of the connector guide can be positioned between two adjacent terminals of a power module.

This makes it possible to avoid any risk of electric arc between the terminals, in particular between the positive DC terminal and the negative DC terminal of the power modules, and/or makes it possible to bring these terminals closer together in space.

Finally, an inverter is disclosed, the inverter including a system as previously described, and further including an electronic board including female connectors to which the pins of the power modules are connected.

BRIEF DESCRIPTION OF THE DRAWINGS

Other features and advantages of the invention will become more apparent in the description below.

In the appended drawings, given by way of non-limiting examples.

DETAILED DESCRIPTION

Figure 1:
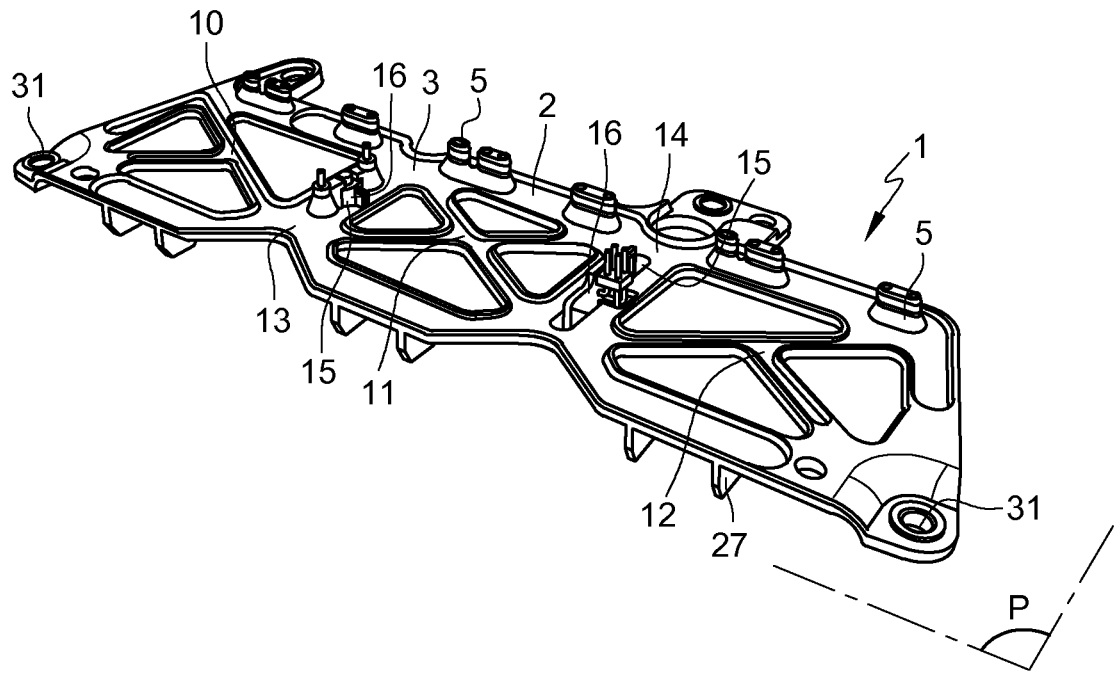
FIG. 1 is a three-dimensional schematic view of a connector guide.
Figure 2:
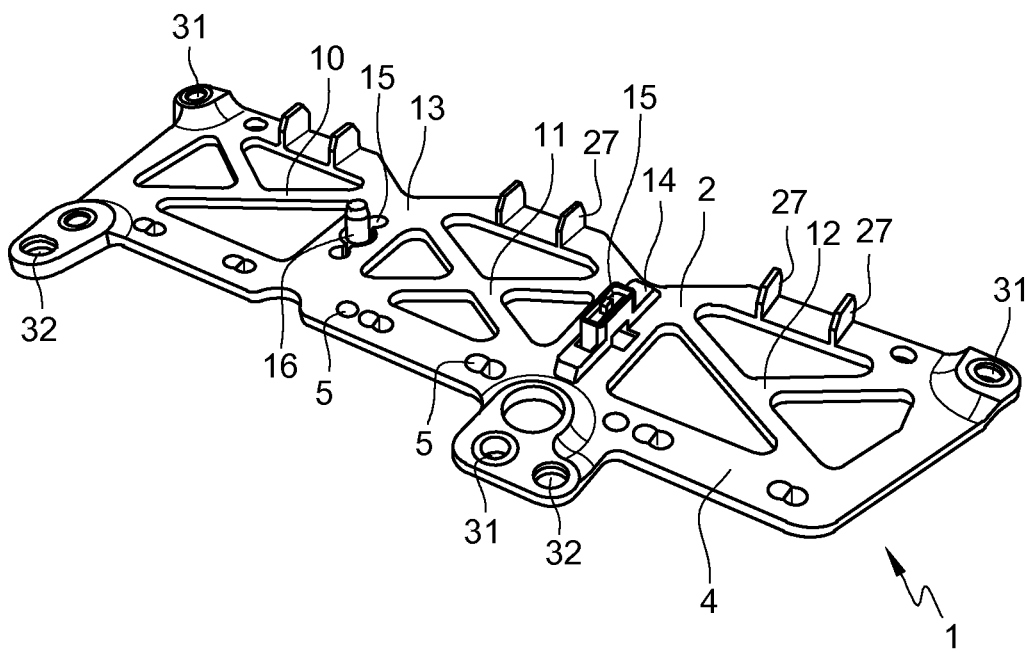
FIG. 2 is another three-dimensional schematic view of the connector guide of FIG. 1.

FIG. 1 and FIG. 2 depict a connector guide 1. The connector guide 1 is advantageously made of a single piece, that is to say that it is advantageously integral. It can be made of a plastic material (including composite). It can especially be injection-molded from a plastic material.

The connector guide includes a body 2, which is flat and extends in a general plane of extension P.

The body 2 includes an upper face 3 and a lower face 4. The upper face 3 is intended to be oriented toward the control board of the inverter equipped with the connector guide, and the lower face 4 is intended to be oriented toward the power modules of the inverter.

The connector guide includes orifices 5 suitable for the passage of male connectors, i.e. connection pins.

"Connection pin" or simply "pin" is intended to mean a male connector in the form of a rigid metal bar suitable for being inserted into a matching female connector.

More particularly, each orifice 5 is dimensioned to allow the passage of a single connection pin. The orifices 5 are distributed and configured on the body 2 of the connector guide 1 in such a way as to ensure that the pins passing through them are precisely positioned and oriented.

Figure 5:
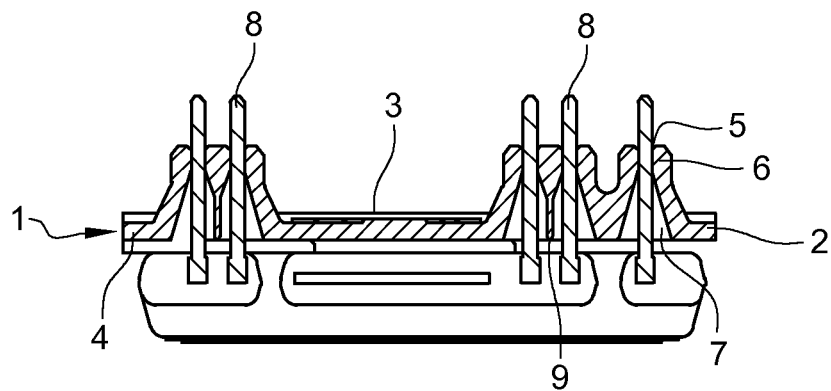
FIG. 5 is a cross-sectional schematic view of the connector guide.

A more particularly envisaged configuration of the orifices 5 is depicted in FIG. 5. According to this configuration, each orifice 5 includes a straight cylindrical upper part 6 and a flared lower part 7.

The flared lower part 7 allows a slight correction of the orientation and positioning of the pins 8 in relation to each other when the connector guide is put in place. The upper part 6 ensures that the pin 8 is correctly retained in position and orientation.

In the embodiment depicted herein, some of the orifices have a tapered, flared lower part 7. However, some of the adjacent orifices 5 are too close together to be able to each have a tapered lower part. In fact, the adjacent tapered parts of these orifices intersect spatially. This increases the risk of a pin 8 being guided toward an orifice that it is not supposed to pass through. In order to limit this risk, a median wall 9 is formed in order to separate the flared portions of two adjacent orifices 5.

In the example of the embodiment of FIG. 1 and FIG. 2, the connector guide 1 is configured to ensure the relative positioning and the relative orientation of the control pins of three power modules, and is thus intended to equip an inverter including three power modules. The body 2 of the connector guide 1 includes three overlapping portions, each designed to overlap, entirely or partially, a power module. The connector guide 1 thus includes: a first overlapping portion 10, a second overlapping portion 11, and a third overlapping portion 12.

Between two overlapping portions, the body of the connector guide includes a solid intermediate portion. In the depicted example, the body 2 of the connector guide 1 includes a first intermediate portion 13 between the first overlapping portion 10 and the second overlapping portion 11, and a second intermediate portion 14 between the second overlapping portion 11 and the third overlapping portion 12. Each intermediate portion 13, 14, is thus produced in the form of an arm, and is intended to be positioned between two power modules (above the power modules).

The intermediate portion includes a housing suitable for receiving a temperature sensor.

In the example depicted, for completeness of the description, the first intermediate portion 13 and the second intermediate portion 14 each include a housing suitable for receiving a temperature sensor. In this case, the housing 15 of the first intermediate portion 13 is suitable for receiving a first type of temperature sensor, while the housing 15 of the second intermediate portion 14 is suitable for receiving a second type of sensor. Although this particular configuration is not excluded from the scope of the claimed invention, the connector guide more frequently includes a single temperature sensor, or two sensors of the same type.

Figure 7:
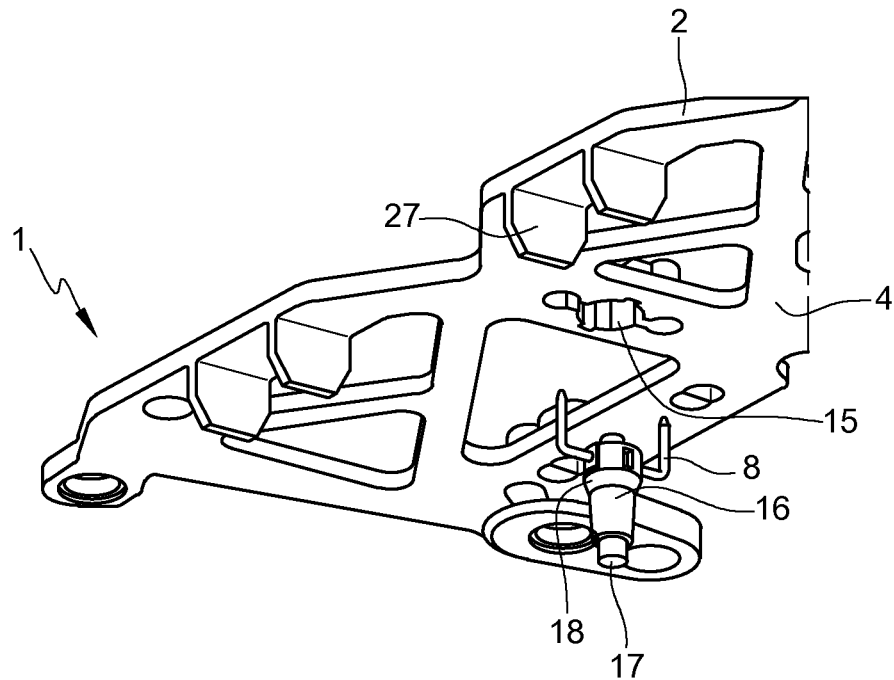
FIG. 7 is a partial three-dimensional schematic view of the assembly of a temperature sensor on the connector guide.
Figure 8:
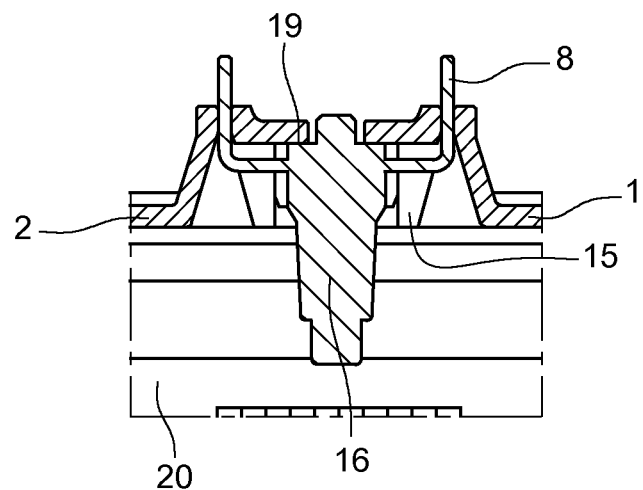
FIG. 8 is a partial cross-sectional view of the temperature sensor of FIG. 7 installed in the connector guide.

The temperature sensor 16 installed in the housing 15 of the first intermediate portion 13 is depicted in greater detail in FIG. 7 and FIG. 8.

The temperature sensor 16 of FIG. 7 and FIG. 8 includes a sensing surface 17 which must be placed in contact with the surface of which the temperature is to be measured. The sensing surface 17 is at the bottom of a main part 18 of the temperature sensor 16. Two pins 8 emerge from the main part 18, and are intended to output the signal from the temperature sensor 16.

The temperature sensor 16 is inserted into the housing 15 from the bottom of the connector guide. In other words, the opening of the housing 15 which allows the temperature sensor 16 to be inserted therein is located on the lower face 4 of the body 2 of the connector guide 1. In this case, the housing 15 includes an upper abutment 19 against which an upper face of the temperature sensor 16 bears. A clipping system can also be provided, preventing the temperature sensor 16 from spontaneously coming out of the housing 15 when the connector guide 1 is lifted and handled. Once the temperature sensor is in the position of use, as depicted in FIG. 8, the sensing surface 17 of the sensor is in contact with a cooling plate 20, which serves to dissipate heat energy from the power modules of the equipped inverter.

In order to ensure this contact, it may be provided for the distance between the upper abutment 19 and the cooling plate 20 to be slightly less (for example by 0.2 mm) than the distance between the upper face of the temperature sensor 16 and the sensing surface 17. The upper abutment 19 can be configured to have the flexibility necessary to allow the assembly and provide a pressing force on the temperature sensor that ensures its contact on the cooling plate 20.

Figure 9:
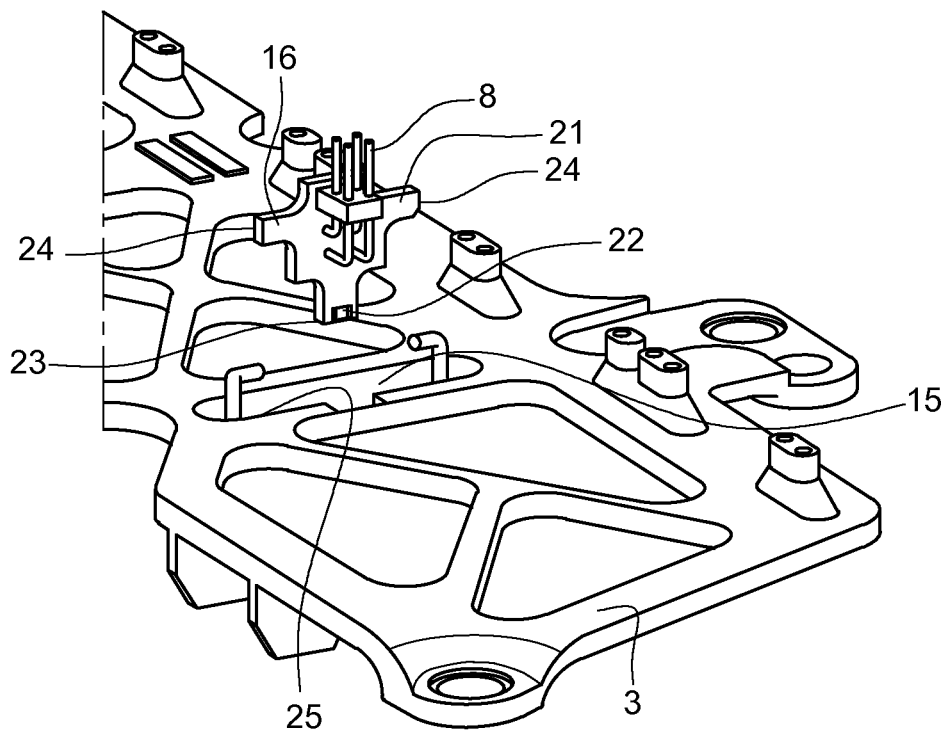
FIG. 9 is a partial three-dimensional schematic view of the assembly of another temperature sensor on a connector guide.
Figure 10:
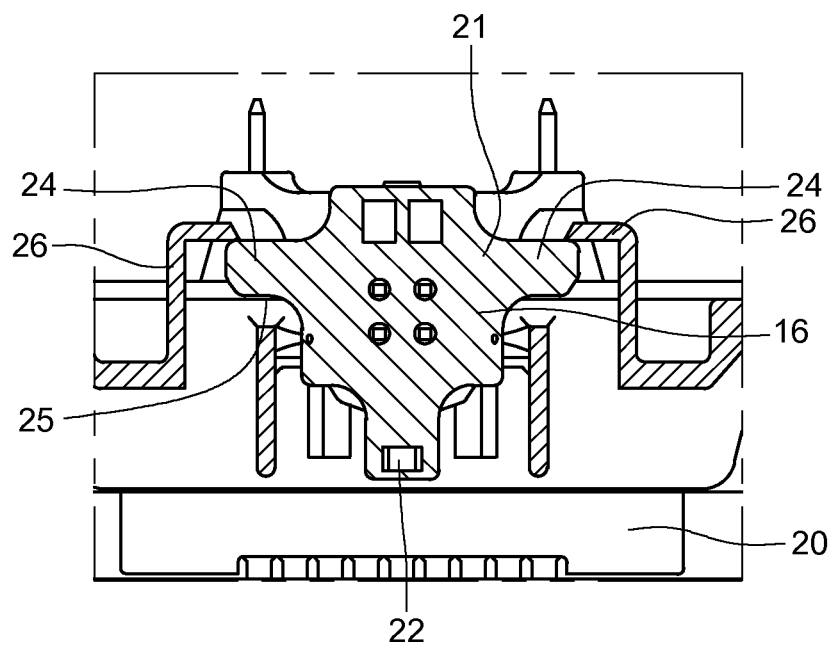
FIG. 10 is a partial cross-sectional view of the temperature sensor of FIG. 9 installed in the connector guide.

The temperature sensor 16 installed in the housing 15 of the second intermediate portion 14 is depicted in greater detail in FIG. 9 and FIG. 10.

The temperature sensor 16 of FIG. 9 and FIG. 10 is of the type including a printed circuit board 21. A thermistor 22, for example of the NTC ("negative temperature coefficient") type is installed at a lower end 23 of the printed circuit board 21.

Pins 8 (here there are four) are connected to the printed circuit board 21, and are intended to deliver the signal from the temperature sensor 16.

The temperature sensor 16 is inserted into the housing 15 via the top of the connector guide. In other words, the opening of the housing 15, which allows the temperature sensor 16 to be inserted therein, is located on the upper face 3 of the body 2 of the connector guide 1.

The printed circuit board 21 includes two fins 24, which bear against an abutment 25 of the housing 15. The housing 15 is open at the lower part thereof, that is, it includes an opening of its bottom, so that the thermistor 22 can be placed in contact with the surface of which the temperature is to be measured.

A retaining device in the form of two movable and/or flexible claws 26 make it possible to immobilize the temperature sensor 16 in the housing 15. Any other retaining device, for example, by clipping, pin, etc., can be used as alternatively or additionally.

The retaining device makes it possible to maintain the sensor 15 in contact with the surface of which the temperature is measured and prevents the temperature sensor 16 from spontaneously coming out of the housing 15 when the connector guide 1 is manipulated.

Thus, once the temperature sensor 16 is in the position of use, as depicted in FIG. 10, the thermistor 22 is in contact with a cooling plate 20, which serves to dissipate heat energy from the power modules of the equipped inverter.

In order to ensure this contact, it is possible to provide for the retaining device to exert a pressing force on the temperature sensor 16 which ensures its contact on the cooling plate 20. Alternatively, or additionally (in this embodiment as in any other embodiment), a highly heat-conductive product, for example a heat-conductive gap filler or a heat-conductive gap pad can be used to ensure heat conduction between the cooling plate and the temperature sensor. As can be seen in particular in FIG. 2, the connector guide 1 may include walls 27 orthogonal to the general plane of extension P of the body of the connector guide 2. The function of these walls 27 is explained in greater detail referring to FIG. 6.

Figure 6:
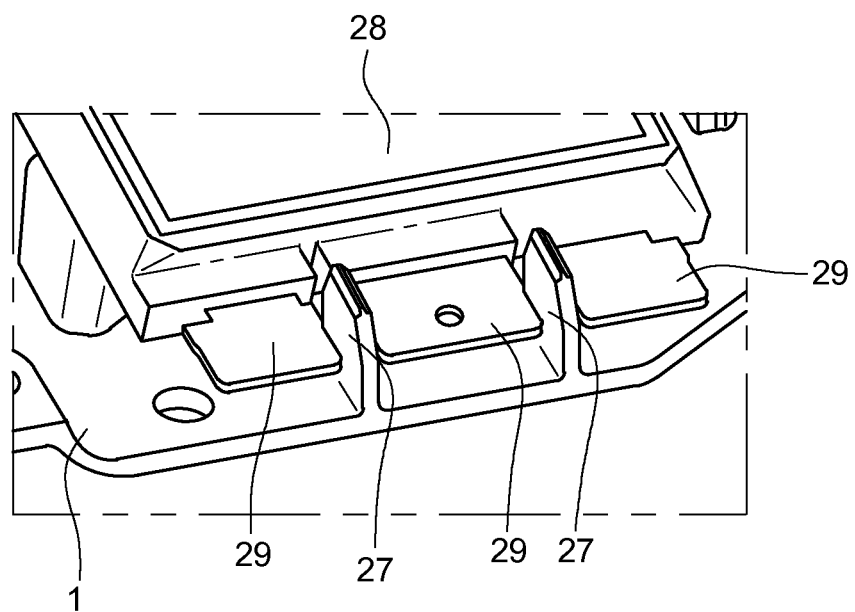
FIG. 6 is a partial three-dimensional schematic view of the connector guide.

FIG. 6 depicts, according to a partial view, a power module 28 installed under the connector guide 1 of FIG. 1 and FIG. 2. The power module includes terminals 29, or "external connections", also referred to as "lead frames", which make it possible to connect the power module to a DC power source as well as to one phase of an electrical machine.

Because of the high voltages in these terminals 29, it is important to ensure good electrical insulation (in particular between the positive DC terminal and the negative DC terminal). To ensure this insulation, and avoid the risk of electric arc formation, a minimum distance must be provided between the terminals 29. The risk of electric arc formation can also be avoided by positioning an insulating material between the terminals. The walls 27 are thus positioned between the terminals 29 of the power modules, when the connector guide is assembled on the power modules.

Figure 3:
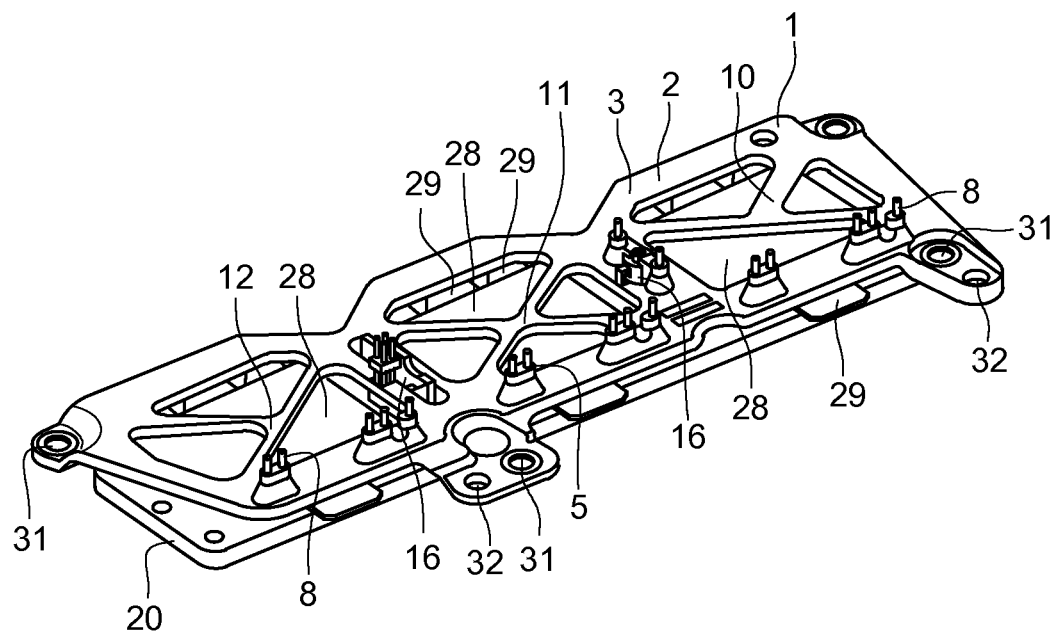
FIG. 3 is a three-dimensional schematic view of a system including the connector guide of FIG. 1.
Figure 4:
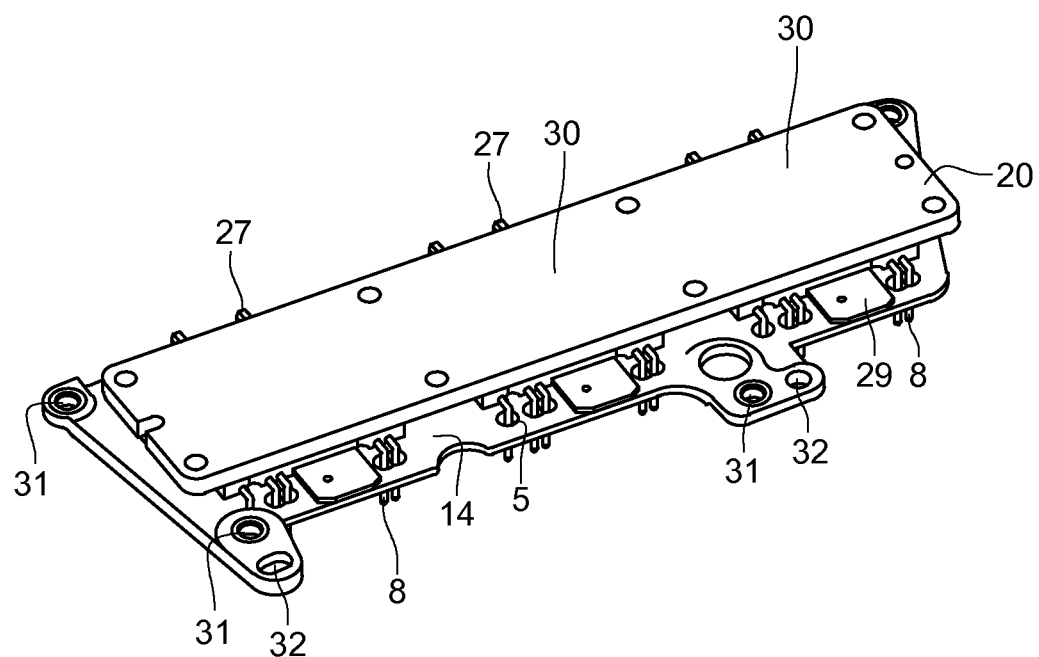
FIG. 4 is another three-dimensional schematic view of the system of FIG. 3.

An assembled system including the connector guide of FIG. 1 and FIG. 2, power modules 28, and a cooling plate 20, is depicted in FIG. 3 and FIG. 4.

In FIG. 3, the upper face 3 of the connector guide is oriented upwards and visible in the foreground. In FIG. 4, the lower face 4 of the connector guide 1 is oriented upwards, so that the cooling plate 20 is visible in the upper portion of the system, in the foreground.

FIG. 3 and FIG. 4 show that the power modules 28 are positioned between the connector guide 1 and the cooling plate 20. The cooling plate 20 is in contact with the power modules and allows the dissipation of heat energy from the power modules 28 into the air or into a coolant, via a dissipation system 30 which may, for example, include numerous fins.

The power modules of the inverter are placed side-by-side in the same plane. This arrangement can be applied to numerous embodiments.

When the connector guide 1 is made to bear on the power modules 28, while the power modules are in contact (directly or via a heat-conductive interface) with the cooling plate 20, the one or more heat sensors 16 are brought into contact with the cooling plate, by extending between two power modules 28.

With the connector guide 1 installed on the power modules 28, a first power module is partially overlapped by the first overlapping portion 10 of the connector guide 1. A second power module is partially overlapped by the second overlapping portion 11 of the connector guide 1. A third power module is partially overlapped by the third overlapping portion 12 of the connector guide 1.

The control pins of each power module 28 pass through the connector guide 1 via the orifices 5 that it includes, so that the relative positioning and orientation thereof are corrected and then maintained. It is then possible to cap the system with an electronic control board (or a single electronic board), with the certainty that the control pins will be inserted precisely and simultaneously into female connectors of the electronic board. The female connectors are, for example, holes that allow the pins 8 to pass through the electronic board and to be soldered to same.

A screen, for example made of steel or aluminum, can optionally be positioned between the connector guide 1 and the electronic board, while being maintained at a distance from the electronic board (e.g. using insulating spacers).

As can be seen especially in FIG. 3 and FIG. 4, the connector guide can also include means for allowing the indexing in position and the securing thereof in the case of an inverter. The indexing can be carried out by means of calibrated orifices 32 for the passage of pins or indexing fingers. The connector guide can, in particular, include two calibrated orifices, made with low positional and dimensional tolerances.

The attachment may be carried out, for example, by screws, through attachment holes 31, which may be provided with inserts, for example made of metal.

Figure 11:
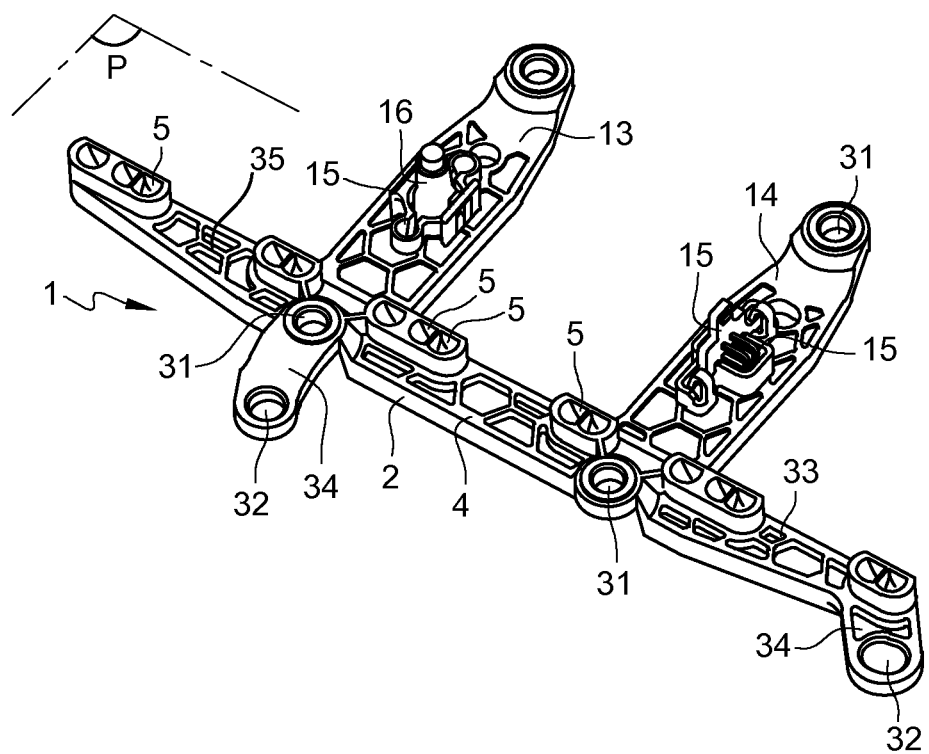
FIG. 11 is a three-dimensional schematic view of a second embodiment of the connector guide.

FIG. 11 depicts, by way of example, another embodiment of the connector guide 1. The connector guide of FIG. 11, although it has a very different overall configuration, is functionally similar to the connector guide of FIGS. 1 to 10. The description of FIGS. 1 to 10 can therefore be generally referred to for the connector of FIG. 11. Compared with FIGS. 1 to 10, the same reference signs are used in FIG. 11 to designate the same elements.

The connector guide 1 is depicted in FIG. 11 with its lower face 4 facing upwards, in the foreground of FIG. 11.

Like the connector guide of FIGS. 1-10, the connector guide 1 of FIG. 11 includes a body 2, which is flat and extends in a general plane of extension P. The connector guide differs essentially from that of FIGS. 1 to 10 in that it includes no overlapping portions of the power modules, or very small overlapping portions. As the connector guide is suitable for an inverter including three power modules, the first intermediate portion 13 and the second intermediate portion 14 are provided in the form of arms intended to be positioned between and above the power modules of the inverter equipped with the connector guide. According to the width of these arms forming an intermediate portion, they may or may not overlap the edge of the power modules located on either side of the arms.

The connector guide of FIG. 11 is thus provided in the general form of a substantially straight main branch 33, in which the orifices 5 for the passage of male connectors are formed, to which two perpendicular branches are connected, forming the intermediate portion 13 and the second intermediate portion 14, respectively. Extensions 34 are provided to allow the centering and the alignment of the connector guide by virtue of the calibrated orifices 32.

Ribs 35 make it possible to structurally stiffen the connector guide. In the exemplary embodiment depicted, the ribs 35 form a geometric pattern able to stiffen the connector guide, for example including shapes that are not deformable or only slightly deformable (triangles, hexagons, etc.).

This stiffening is important in the configuration of the connector guide depicted, since it includes an elongate portion and centered attachment holes 31. This stiffening also avoids possible vibration problems during the manufacture of the inverter. The manufacture of the connector guide by plastic injection is also facilitated by the fact that the ribs 35 make it possible to keep a constant thickness for the entire connector guide.

The connection guide thus developed makes it possible both to ensure the position and orientation of the control pins of the power modules when assembling an inverter, and to position one (or more) temperature sensors in the inverter.

This also enables safe and reliable assembly of an electronic board (typically a control board) including female connectors that are to receive the control pins of the power modules.

The invention claimed is:

1. A connector guide for an inverter including at least two power modules, namely at least a first power module and a second power module,
the connector guide including a substantially flat rigid body in which orifices are formed for the passage of control pins of the at least two power modules, said orifices being calibrated and positioned in such a way as to conform to the position and orientation of said control pins, the body of the connector guide including an intermediate portion which is intended to be positioned between the first power module and the second power module,
wherein the intermediate portion includes a housing suitable for receiving a temperature sensor.

2. The connector guide according to claim 1, wherein the orifices for the passage of the pins include a straight cylindrical upper part and a flared lower part.

3. The connector guide according to claim 2, wherein the flared lower part of all or some of the orifices is tapered.

4. The connector guide according to claim 2, wherein the flared lower part of two adjacent orifices includes a straight median wall.

5. The connector guide according to claim 1, wherein the housing suitable for receiving a temperature sensor is open on a lower face of the body of the connector guide so as to be able to insert the temperature sensor into the housing via said lower face and bring it into abutment on an upper abutment of said housing.

6. The connector guide according to claim 1, wherein the housing suitable for receiving a temperature sensor is open on an upper face of the body of the connector guide so that the temperature sensor can be inserted into the housing via said upper face, the housing further including an abutment allowing the temperature sensor to be brought into abutment, said housing further including a bottom opening allowing the temperature sensor to protrude, the housing further being provided with a device for retaining the temperature sensor.

7. The connector guide according to claim 1, wherein the body of the connector guide includes a first overlapping portion intended to at least partially overlap the first power module, and the body of the connector guide includes a second overlapping portion intended to at least partially overlap the second power module.

8. The connector guide according to claim 7, including three overlapping portions for at least partial overlapping of three power modules.

9. A connector guide according to claim 1, wherein the connector guide includes at least one wall orthogonal to a general plane of extension of the body of the connector guide.

10. A system including:
a plurality of power modules; each power module including control pins,
a connector guide according to claim 1, with each control pin of the power modules passing through an orifice of the connector guide,
a temperature sensor installed in the housing, and
a cooling plate in contact with the power modules, the temperature sensor being in contact with the cooling plate.

11. The system according to claim 10, including a connector guide, the connector guide including at least one wall orthogonal to a general plane of extension of the body of the connector guide, wherein each power module includes terminals which extend substantially parallel to the general plane of extension of the body of the connector guide, and wherein the at least one wall of the connector guide is positioned between two adjacent terminals of a power module.

12. An inverter including a system according to claim 10, further including an electronic board including female connectors to which the pins of the power modules are connected.

* * * * *